US012667019B2

(12) United States Patent
Kim

(10) Patent No.: US 12,667,019 B2
(45) Date of Patent: Jun. 23, 2026

(54) SEMICONDUCTOR PACKAGE

(71) Applicant: SAMSUNG ELECTRONICS CO., LTD., Suwon-si (KR)

(72) Inventor: Hongjin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 502 days.

(21) Appl. No.: 18/319,193

(22) Filed: May 17, 2023

(65) Prior Publication Data

US 2024/0079400 A1     Mar. 7, 2024

(30) Foreign Application Priority Data

Sep. 6, 2022     (KR) ........................ 10-2022-0112600

(51) Int. Cl.
H01L 25/18          (2023.01)
H10B 80/00          (2023.01)
(Continued)

(52) U.S. Cl.
CPC ............ H10W 90/00 (2026.01); H10B 80/00 (2023.02); H10W 70/611 (2026.01); H10W 70/65 (2026.01); H10W 72/07354 (2026.01); H10W 72/07554 (2026.01); H10W 72/347 (2026.01); H10W 72/547 (2026.01); H10W 72/5473 (2026.01); H10W 72/865 (2026.01); H10W 72/877 (2026.01); H10W 72/884 (2026.01); H10W 90/24 (2026.01);
(Continued)

(58) Field of Classification Search
CPC ......... H01L 25/071; H01L 2225/06562; H01L 25/18
See application file for complete search history.

(56) References Cited

U.S. PATENT DOCUMENTS 9,165,897 B2     10/2015   Lee
10,658,350 B2     5/2020   Lee et al.
(Continued)

FOREIGN PATENT DOCUMENTS

KR     10-2015-0085687 A     7/2015
KR     10-2022-0055112 A     5/2022
KR     10-2022-0067572 A     5/2022

*Primary Examiner* — Yu-Hsi D Sun
(74) *Attorney, Agent, or Firm* — Wolf, Greenfield & Sacks, P.C.

(57) ABSTRACT

A semiconductor package includes a substrate, a controller chip on a first surface of the substrate, a first chip stack on the controller chip, a second chip stack on the substrate in adjacent spaced apart relationship with the first chip stack, a third chip stack including a first group of semiconductor chips above or below the first chip stack and a second group of semiconductor chips above or below the second chip stack. A buffer chip is on the substrate between the first chip stack and the second chip stack, and the buffer chip is electrically connected to the third chip stack and the controller chip. An encapsulant encapsulates at least a portion of the first chip stack, the second chip stack, and the third chip stack. Connection bumps are on an opposite second surface of the substrate. The first chip stack and the second chip stack are directly electrically connected to the controller chip, and the third chip stack is electrically connected to the controller chip by the buffer chip.

19 Claims, 8 Drawing Sheets

100A

(51) Int. Cl.

| | |
|---|---|
| *H10W 90/00* | (2026.01) |
| *H10W 70/60* | (2026.01) |
| *H10W 70/65* | (2026.01) |
| *H10W 72/00* | (2026.01) |
| *H10W 72/30* | (2026.01) |
| *H10W 72/50* | (2026.01) |
| *H10W 90/24* | (2026.01) |

(52) U.S. Cl.
CPC ........ *H10W 90/724* (2026.01); *H10W 90/732* (2026.01); *H10W 90/734* (2026.01); *H10W 90/752* (2026.01); *H10W 90/754* (2026.01)

(56) References Cited

U.S. PATENT DOCUMENTS

| | | | |
|---|---|---|---|
| 11,133,291 B2 | 9/2021 | Su et al. | |
| 11,309,300 B2 | 4/2022 | Kim | |
| 2014/0185389 A1* | 7/2014 | Jeon | G06F 3/0604 |
| | | | 365/189.05 |
| 2014/0252640 A1 | 9/2014 | Kwak | |
| 2018/0005994 A1 | 1/2018 | Ph | |
| 2020/0075543 A1 | 3/2020 | Kosaka | |
| 2021/0065803 A1* | 3/2021 | Lee | G11C 16/06 |
| 2021/0242171 A1* | 8/2021 | Lee | H10W 90/00 |
| 2022/0130793 A1* | 4/2022 | Kang | H01L 25/18 |
| 2022/0415852 A1* | 12/2022 | Kang | H10W 90/00 |

\* cited by examiner

100B $$CS3\begin{cases}140\text{-}1\\140\text{-}2\end{cases} \qquad CT1\begin{cases}CS1\\CS3(140\text{-}1)\end{cases}$$

$$CT2\begin{cases}CS2\\CS3(140\text{-}2)\\CS4\end{cases}$$

SEMICONDUCTOR PACKAGE

CROSS-REFERENCE TO RELATED APPLICATION

This application claims priority under 35 U.S.C. § 119 to Korean Patent Application No. 10-2022-0112600, filed on Sep. 6, 2022, in the Korean Intellectual Property Office, the disclosure of which is incorporated herein by reference in its entirety.

BACKGROUND

1. Field

The present inventive concept relates to semiconductor packages.

2. Description of Related Art

Recently, high-performance and high-capacitance semiconductor packages are required to be mounted in electronic devices. Accordingly, the development of a semiconductor package in which a plurality of semiconductor chips and a control chip for controlling operations thereof are embedded together is being developed.

SUMMARY

An aspect of the present inventive concept is to provide a semiconductor package including semiconductor chips forming a plurality of chip stacks, while having a reduced thickness.

According to an aspect of the present inventive concept, a semiconductor package includes a substrate having an interconnection circuit; a controller chip on a first surface of the substrate, the controller chip electrically connected to the interconnection circuit; a first chip stack on the controller chip, the first chip stack electrically connected to the interconnection circuit; a second chip stack on the substrate in adjacent spaced apart relationship with the first chip stack, the second chip stack electrically connected to the interconnection circuit; a third chip stack including a first group of semiconductor chips above or below the first chip stack and a second group of semiconductor chips above or below the second chip stack, the third chip stack electrically connected to the interconnection circuit; a buffer chip on the substrate between the first chip stack and the second chip stack, the buffer chip electrically connected to the third chip stack and the controller chip through the interconnection circuit; an encapsulant encapsulating at least a portion of the first chip stack, the second chip stack, and the third chip stack; and connection bumps on an opposite second surface of the substrate, the connection bumps electrically connected to the interconnection circuit. The first chip stack and the second chip stack are directly connected to the controller chip, and the third chip stack is connected to the controller chip by the buffer chip.

According to an aspect of the present inventive concept, a semiconductor package includes a substrate including an interconnection structure; a controller chip and a buffer chip on the substrate in adjacent spaced apart relationship, the controller chip and buffer chip electrically connected to each other by the interconnection circuit; first and second chip structures on the substrate in adjacent spaced apart relationship, the first and second chip structures including a plurality of chip stacks electrically connected to the controller chip through the interconnection circuit; and an encapsulant encapsulating at least a portion of the first and second chip structures on the substrate. The plurality of chip stacks include a first chip stack included in the first chip structure, a second chip stack included in the second chip structure, and a third chip stack having semiconductor chips in the first chip structure and semiconductor chips in the second chip structure. The third chip stack is electrically connected to the controller chip by the buffer chip.

According to an aspect of the present inventive concept, a semiconductor package is provided, the semiconductor package includes a substrate including an interconnection circuit; a controller chip and a buffer chip on the substrate in adjacent spaced apart relationship, the controller chip and buffer chip electrically connected to each other by the interconnection circuit; first and second chip structures on the substrate in adjacent spaced apart relationship, the first and second chip structures including a plurality of chip stacks electrically connected to the controller chip through the interconnection circuit; and an encapsulant encapsulating at least a portion of the first and second chip structures. A first portion of the plurality of semiconductor chips in the plurality of chip stacks are directly connected to the controller chip, and a second portion of the semiconductor chips in the plurality of chip stacks are connected to the controller chip by the buffer chip.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred example embodiments of the present inventive concept will be described with reference to the accompanying drawings as follows.

Figure 1:
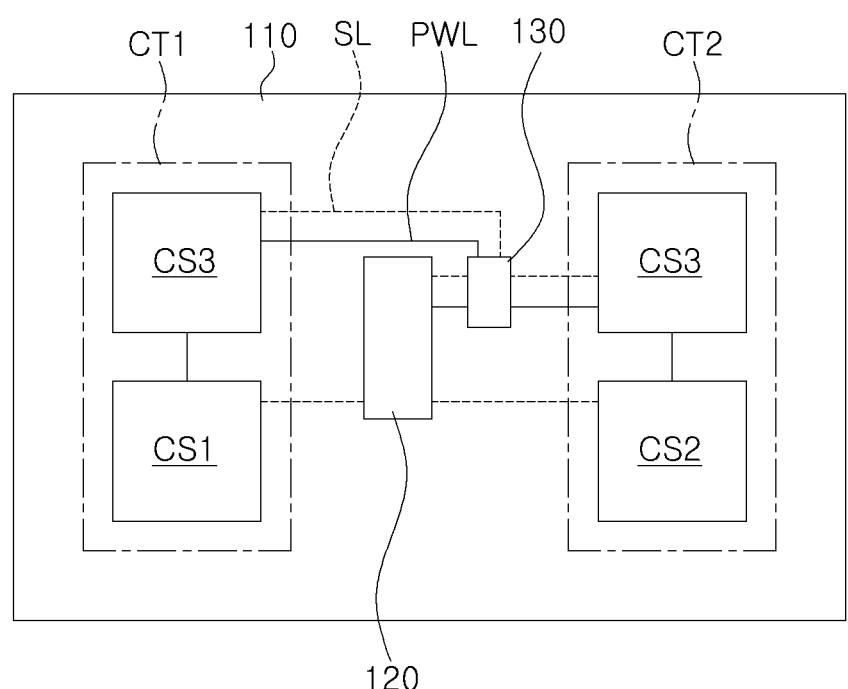
FIG. 1 is a diagram schematically illustrating an electrical connection relationship in a semiconductor package according to an example embodiment of the present inventive concept.

FIG. 1 is a diagram schematically illustrating an electrical connection relationship in a semiconductor package 100 according to an example embodiment of the present inventive concept.

Referring to FIG. 1, a semiconductor package 100 according to an example embodiment may include a substrate 110, a controller chip 120, a buffer chip 130, and a plurality of chip structures CT1 and CT2.

The substrate 110 may include a signal line SL and a power/ground line PWL (hereinafter, referred to as 'power line'). The signal line SL may electrically connect chip stacks CS1, CS2, and CS3 of the plurality of chip structures CT1 and CT2 to the controller chip 120 and/or the buffer chip 130. The signal line SL may be configured to transfer signals and/or data of the chip stacks CS1, CS2, and CS3 directly to the controller chip 120 or to the controller chip 120 by the buffer chip 130. The power line PWL may apply a power voltage and/or a ground voltage to the controller chip 120, the buffer chip 130, and the plurality of chip structures CT1 and CT2. The signal line SL and the power line PWL may be connected to external devices such as a module substrate and a system board in a region, not illustrated in the drawings.

The controller chip 120 and the buffer chip 130 may be disposed on the substrate 110 to be adjacent to each other, and electrically connected to each other by the signal line SL and the power line PWL. The controller chip 120 may include a control circuit for determining a data processing order of the chip stacks CS1, CS2, and CS3, and preventing errors and bad sectors. The buffer chip 130 may include a buffer circuit for controlling loading of the chip stacks CS1, CS2, and CS3. The buffer chip 130 may include, for example, a Frequency Boosting Interface (FBI) chip The plurality of chip structures CT1 and CT2 may be disposed on the substrate 110 to be spaced apart from each other, and may include a plurality of chip stacks CS1, CS2, and CS3. For example, the plurality of chip structures CT1 and CT2 may include a first chip structure CT1 including a first chip stack CS1 and a third chip stack CS3, and a second chip structure CT2 including a second chip stack CS2 and a third chip stack CS3. Here, each of the chip stacks CS1, CS2, and CS3 may be understood as a set of semiconductor chips forming a channel with the controller chip 120. For example, a triple channel may be formed between the first chip stack CS1, the second chip stack CS2, and the third chip stack CS3 and the controller chip 120. That is, although the third chip stack CS3 is disposed in a distributed manner in the first and second chip structures CT1 and CT2, it can communicate with the controller chip 120 through the same channel.

In the present inventive concept, by distributing the third chip stack CS3 (or semiconductor chips constituting the third chip stack CS3) to the first chip structure CT1 and the second chip structure CT2, spaced apart from each other, a height of the first chip structure CT1 or the second chip structure CT2 may be reduced. In addition, by introducing a buffer chip 130 connecting the distributed third chip stack CS3 (or semiconductor chips of the distributed third chip stack CS3) to the controller chip 120, a semiconductor package 100 having a reduced thickness may be implemented without deterioration of electrical characteristics. For example, semiconductor chips forming the first and second chip stacks CS1 and CS2 may be directly connected to the controller chip 120, and semiconductor chips forming the third chip stack CS3 may be connected to the controller chip 120 by the buffer chip 130.

Figure 2A:
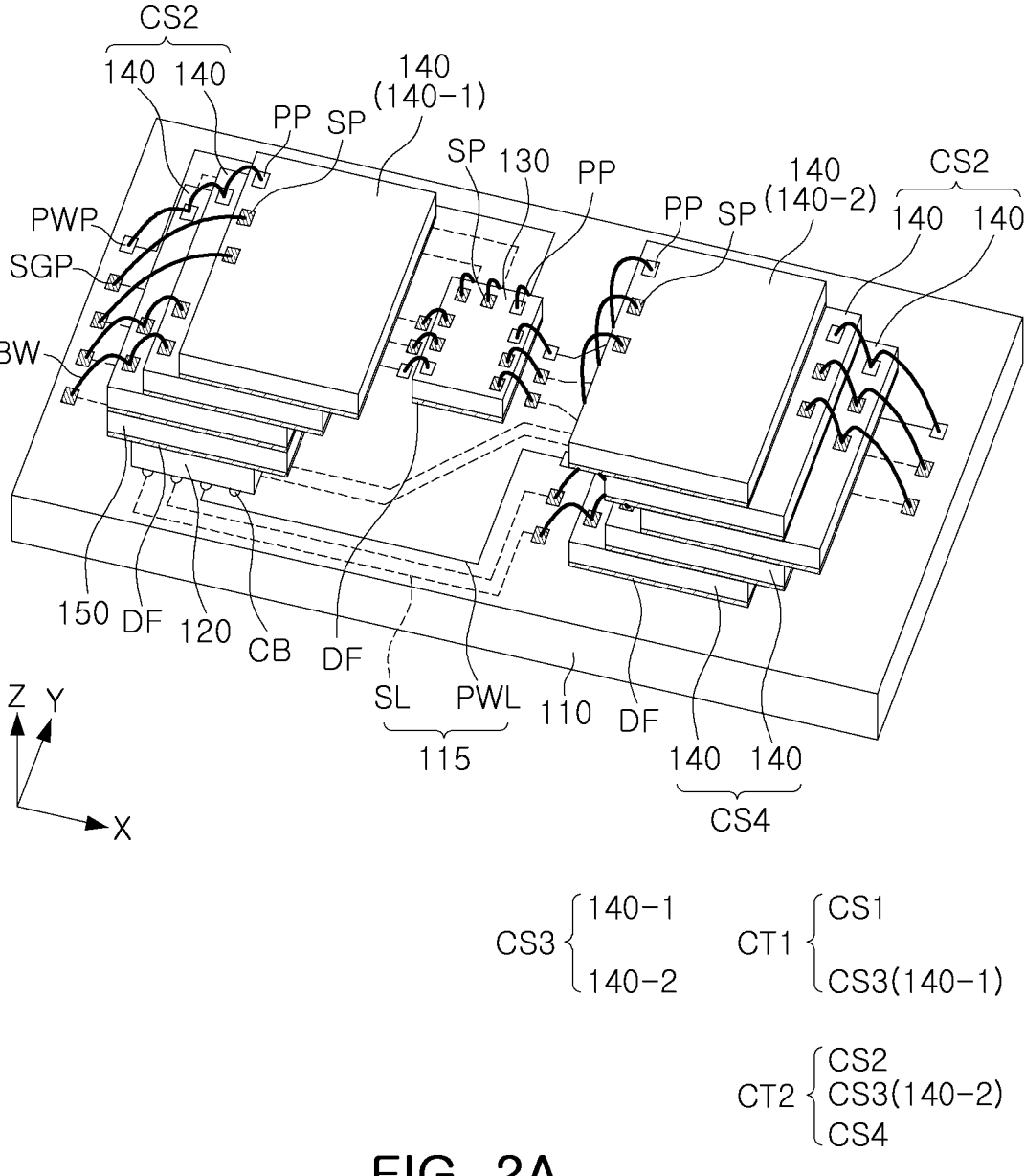
FIG. 2A is a perspective view schematically illustrating a physical connection relationship of some components of a semiconductor package according to an example embodiment of the present inventive concept.
Figure 2B:
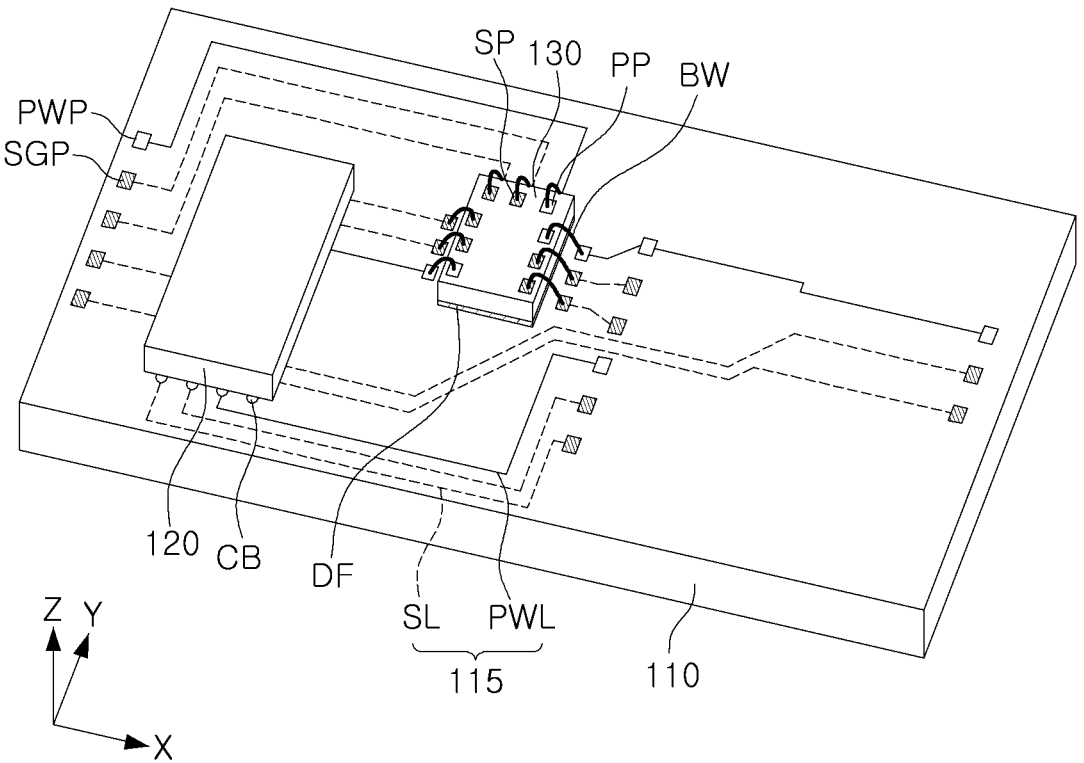
FIG. 2B is a perspective view schematically illustrating an electrical connection relationship of some components of FIG. 2A.

FIG. 2A is a perspective view schematically illustrating a physical connection relationship of some components of the semiconductor package 100 according to an example embodiment of the present inventive concept, and FIG. 2B is a perspective view schematically illustrating an electrical connection relationship of some components of FIG. 2A.

Referring to FIGS. 2A and 2B, the semiconductor package 100 according to an example embodiment may include: a substrate 110 including an interconnection circuit 115; a controller chip 120 and a buffer chip 130 electrically connected to each other by an interconnection circuit 115; and a first chip structure CT1 and a second chip structure CT2 including a plurality of chip stacks CS1, CS2, CS3, and CS4 electrically connected to the controller chip 120 through the interconnection circuit 115.

The substrate 110 may include an interconnection circuit 115 having a signal line SL and a power line PWL, and a signal terminal (SGP) a power/ground terminal (PWP) (hereinafter referred to as 'power terminal'), electrically connected to the signal line SL and the power line PWL of the interconnection circuit 115, respectively. The layout and shape of the interconnection circuit 115, the signal terminal (SGP) and the power terminal (PWP) are not particularly limited, and may be variously modified according to example embodiments. The signal terminal SGP may be electrically connected to the controller chip 120, the buffer chip 130, and signal pads SP the semiconductor chips 140. The power terminal PWP may be electrically connected to the controller chip 120, the buffer chip 130, and power/ground pads PP (hereinafter referred to as "power pads") of the semiconductor chips 140. The controller chip 120, the buffer chip 130, and the semiconductor chips 140 may share a power voltage and/or a ground voltage through a power terminal PWP and a power line PWL. The signal terminal (SGP) and the power terminal (PWP) may be electrically connected to an external connection terminal (see '110P' in FIG. 3) on a lower surface of the substrate 110 through the interconnection circuit 115.

The controller chip 120 may be disposed between the first chip structure CT1 and the substrate 110. The controller chip 120 may be flip-chip bonded on the substrate 110 and electrically connected to the interconnection circuit 115 of the substrate 110 through a conductive bump CB. The controller chip 120 may be connected to a plurality of chip stacks CS1, CS2, CS3, and CS4 through the signal line SL of the interconnection circuit 115. A communication channel corresponding to the number of the plurality of chip stacks CS1, CS2, CS3, and CS4 may be formed between the controller chip 120 and the plurality of chip stacks CS1, CS2, CS3, and CS4.

The buffer chip 130 may be disposed on the substrate 110 between the first chip structure CT1 and the second chip structure CT2. The buffer chip 130 may be wire-bonded to the substrate 110, and electrically connected to the interconnection circuit 115 of the substrate 110 through a bonding wire BW. The buffer chip 130 may be connected to semiconductor chips 140 of the third chip stack CS3 distributed to the first chip structure CT1 and the second chip structure CT2 through the signal line SL of the interconnection circuit 115. The buffer chip 130 may control loading of the semiconductor chips 140 of the third chip stack CS3, for example, a first group of semiconductor chips 140-1 and a second group of semiconductor chips 140-2, so that electrical characteristics between the controller chip 120 and the third chip stack CS3, for example, Signal Integrity (SI) characteristics, Power Integrity (PI) characteristics, communication speed, and the like, may be improved.

The plurality of chip stacks CS1, CS2, CS3, and CS4 may include a plurality of semiconductor chips 140 stacked in a vertical direction (Z direction). The plurality of semiconductor chips 140 may include a non-volatile memory chip such as flash memory, phase-change random access memory (PRAM), magnetic random access memory (MRAM), ferroelectric random access memory (FeRAM), or resistive random access memory (RRAM), and/or a volatile memory chip such as dynamic random access memory (DRAM) or static random access memory (SRAM). The plurality of semiconductor chips 140 may be attached to the substrate 110 or attached to each other by an adhesive film DF. The plurality of semiconductor chips 140 may include signal pads SP and power/ground pads PP (hereinafter referred to as 'power pads'). In the drawings, the plurality of semiconductor chips 140 are stacked in a shifted manner in the vertical direction (Z direction) so that the pads are exposed, but the present disclosure is not limited thereto. The plurality of semiconductor chips 140 may be wire bonded to the substrate 110. The signal pads SP of the plurality of semiconductor chips 140 may be connected to a signal terminal SGP of the substrate 110 through the bonding wire BW, and the power pads PP of the plurality of semiconductor chips 140 may be connected to a power terminal PWP of the substrate 110 through the bonding wire BW.

The plurality of chip stacks CS1, CS2, CS3, and CS4 may include a first chip stack CS1, a second chip stack CS2, and a third chip stack, communicating with the controller chip 120, respectively, through a separate channel. For example, the plurality of chip stacks CS1, CS2, CS3, and CS4 may include a first chip stack CS1 included in the first chip structure CT1, a second chip included in the second chip structure CT2, and a third chip stack CS3 distributedly included in the first chip structure CT1 and the second chip structure CT2. The first chip stack CS1 may be disposed on an upper surface of the controller chip 120. The second chip stack CS2 may be disposed to be spaced apart from the first chip stack CS1 and the controller chip 120. The third chip stack CS3 may include a first group of semiconductor chips 140-1 disposed above or below the first chip stack CS1 and a second group of semiconductor chips 140-2 disposed above or below the second chip stack CS2. The plurality of chip stacks CS1, CS2, CS3, and CS4 may include a greater number of semiconductor chips 140 than is illustrated in the drawings.

The number of semiconductor chips 140 of the third chip stack CS3 may be equal to the number of semiconductor chips 140 of the first chip stack CS1 and the number of semiconductor chips 140 of the second chip stack CS2. However, according to an example embodiment of the present inventive concept, since the semiconductor chips 140 constituting the third chip stack CS3 are distributedly disposed in the first chip structure CT1 and the second chip structure CT2 (i.e., a first group of semiconductor chips 140-1 are in the first chip structure CT1 and a second group of semiconductor chips 140-2 are in the second chip structure CT2), the number of the first group of semiconductor chips 140-1 may be smaller than the number of semiconductor chips 140 of the first chip stack CS1, and the number of the second group of semiconductor chips 140-2 is greater than the number of semiconductor chips 140 of the second chip stack CS2. In addition, the number of the first group of semiconductor chips 140-1 may be equal to the number of semiconductor chips 140-2 of the second group, but the present inventive concepts not limited thereto.

As described above, in the present inventive concept, by distributing (i.e., dividing up) the semiconductor chips in the third chip stack CS3 into a first group of semiconductor chips 140-1 and a second group of semiconductor chips 140-2, and connecting the same to the controller chip 120 through the buffer chip 130, the heights of the chip structures CT1 and CT2 and the thickness of the semiconductor package 100 may be reduced without deterioration of electrical characteristics. Accordingly, the semiconductor chips 140 constituting the first chip stack CS1 and the second chip stack CS2 may be directly connected to the controller chip 120, and the first group of semiconductor chips 140-1 constituting the third chip stack CS3 and the second group of semiconductor chips 140-2 may be connected to the controller chip 120 by the buffer chip 130. For example, a first signal pad SP of the first chip stack CS1, a second signal pad SP of the second chip stack CS2, and a third signal pad SP of the third chip stack CS3 may be electrically insulated from each other, and the first signal pad SP of the first chip stack CS1 and the second signal pad SP of the second chip stack CS2 may be electrically insulated from the buffer chip 130, and the third signal pad SP of the third chip stack CS3 may be electrically connected to the buffer chip 130.

Depending on an example embodiment, the second chip structure CT2 may further include a fourth chip stack CS4 disposed above or below the second chip stack CS2, and electrically connected to the interconnection circuit 115. The fourth chip stack CS4 may be directly connected to the controller chip 120, like the second chip stack CS2. A communication channel for data transmission and reception may be formed between the fourth chip stack CS4 and the controller chip 120.

Depending on an example embodiment, a spacer 150 may be disposed between the controller chip 120 and the first chip structure CT1. For example, the semiconductor package 100 may further include a spacer disposed between the controller chip 120 and the first chip stack CS1 or between the controller chip 120 and the first group of semiconductor chips 140-1. The spacer 150 may be a dummy silicon spacer chip for supporting the plurality of semiconductor chips 140. The spacer 150 may be attached to the controller 120 by an adhesive film DF.

Figure 3:
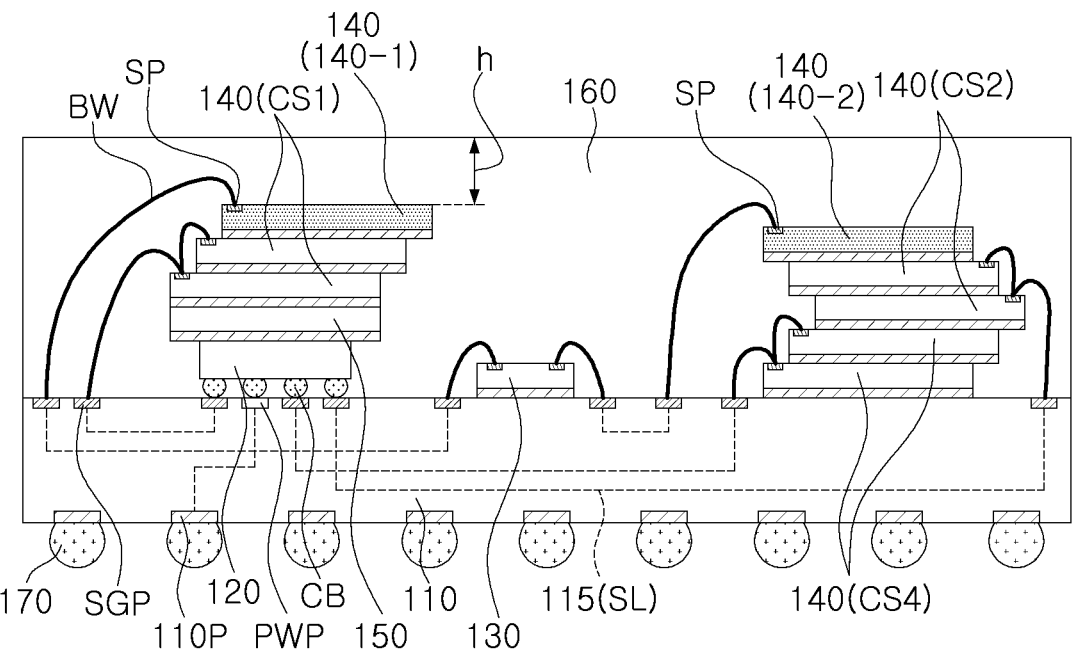
FIG. 3 is a cross-sectional view illustrating a semiconductor package according to an example embodiment of the present inventive concept.

FIG. 3 is a cross-sectional view illustrating a semiconductor package 100A according to an example embodiment of the present inventive concept.

Referring to FIG. 3, the semiconductor package 100A according to an example embodiment has the same or similar features as those described with reference to FIGS. 1 to 2B, except for further including an encapsulant 160 and/or connection bumps 170, so that overlapping descriptions will be omitted below.

The substrate 110 may be a substrate for a semiconductor package including a printed circuit board (PCB), a ceramic substrate, a glass substrate, a tape interconnection board, and the like. For example, the substrate 110 may be a double-sided printed circuit board (PCB) or a multilayer printed circuit board (multilayer PCB). The substrate 110 may include a signal terminal (SEW), a power terminal (PWP), an external connection terminal 110P, and an interconnection circuit 115 electrically connecting the same. The signal terminal SGP and the power terminal PWP may be connected to an external device such as a module substrate or a system board through an external connection terminal 110P. The terminals SGP, PWP, and 110P and the interconnection circuit 115 may include at least one metal among copper (Cu), aluminum (Al), nickel (Ni), silver (Ag), gold (Au), platinum (Pt), tin (Sn), Lead (Pb), titanium (Ti), chromium (Cr), palladium (Pd), indium (In), zinc (Zn), and carbon (C) or an alloy composed of two or more metals thereof. Connection bumps 170 may be disposed below the external connection terminal 110P. The connection bumps 170 may include, for example, tin (Sn) or an alloy containing tin (Sn) (e.g., Sn—Ag—Cu). The connection bumps 170 may be electrically connected to external devices such as a module substrate, a system board, and the like.

The controller chip 120 may be disposed below the first chip structure CT1, and connected to an interconnection circuit 115 of the substrate 110 through a conductive bump CB. The controller chip 120 may be electrically connected to the first chip stack CS1, the second chip stack CS2, the third chip stack CS3, and the fourth chip stack CS4 through the interconnection circuit 115. The buffer chip 130 may be disposed between the first chip structure CT1 and the second chip structure CT2, and connected to the interconnection circuit 115 of the substrate 110 through a bonding wire BW. The buffer chip 130 may be connected to the third chip stack CS3 through the interconnection circuit 115, for example, a first group of semiconductor chips 140-1 and a second group of semiconductor chips 140-2. The controller chip 120 and the buffer chip 130 may have the same or similar features as those described with reference to FIGS. 1 to 2B.

The first chip structure CT1 may include semiconductor chips in the first chip stack CS1 and a first group of semiconductor chips 140-1 from the third chip stack CS3. The second chip structure CT2 may include semiconductor chips in the second chip stack CS2, a remaining or second group semiconductor chips 140-2 from the third chip stack CS3, and semiconductor chips in the fourth chip stack CS4. The semiconductor chips 140 included in the same chip stack may communicate with the controller chip 120 through the same channel. The first group of semiconductor chips 140-1 and the second group of semiconductor chips 140-2 from the third chip stack may be connected to the controller chip 120 through the buffer chip 130. In the present example embodiment, each of the first group of semiconductor chips 140-1 and the second group of semiconductor chips 140-2 from the third chip stack are disposed on top of the first and second chip structures CT1 and CT2, but the present inventive concept is not limited thereto. According to example embodiments, the first group of semiconductor chips 140-1 and the second group of semiconductor chips 140-2 from the third chip stack may be disposed in a position, lower than the other chip stacks CS1, CS2, and CS4 (see FIGS. 4 to 6). Depending on example embodiments, the chip stacks CS1, CS2, CS3, and CS4 may include a greater number of semiconductor chips 140 than those illustrated in the drawing (see FIG. 7).

The encapsulant 160 may encapsulate at least a portion of the first chip structure CT1 and the second chip structure CT2 on the substrate 110. The encapsulant 160 may include a thermosetting resin such as an epoxy resin, a thermoplastic resin such as polyimide, or a material impregnated with inorganic fillers in these resins, for example, prepreg, Ajinomoto Build-up Film (ABF), FR-4, Bismaleimide Triazine (BT), an Epoxy Molding Compound (EMC), and the like. Considering a loop height of the bonding wire BW, a tolerance of the encapsulant 160, and the like, a thickness of the encapsulant 160 covering the uppermost semiconductor chip (e.g., a first group of semiconductor chips 140-1) among the semiconductor chips 140 included in the chip structures CT1 and CT2 may be about 100 μm or more, for example, in a range of about 100 μm to about 150 μm, about 110 μm to about 130 μm, and the like. As described above, regardless of a position of the first group of semiconductor chips 140-1, by distributing the semiconductor chips 140 constituting the third chip stack CS3 into a first group of semiconductor chips 140-1 and a second group of semiconductor chips 140-2, heights of the first and second chip structures CT1 and CT2 may be reduced, and an interval between the encapsulant 160 and the chip structures CT1 and CT2 may be secured.

Figure 4:
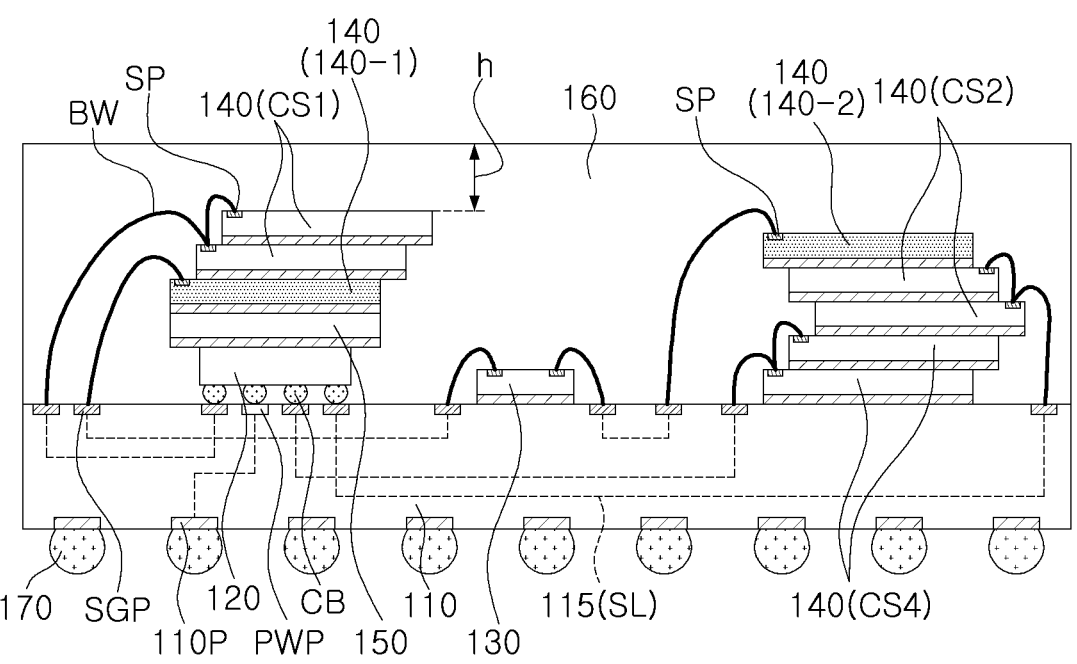
FIG. 4 is a cross-sectional view illustrating a semiconductor package according to an example embodiment of the present inventive concept.

FIG. 4 is a cross-sectional view illustrating a semiconductor package 100B according to an example embodiment of the present inventive concept.

Referring to FIG. 4, the semiconductor package 100B according to an example embodiment may have the same or similar characteristics as those described with reference to FIGS. 1 to 3, except that a first group of semiconductor chips 140-1 are disposed below the first chip stack CS1. The first group of semiconductor chips 140-1 according to this example embodiment may be disposed between a spacer 150 and the first chip stack CS1. The first group of semiconductor chips 140-1 may be connected to the buffer chip 130 through the signal terminal SGP and the signal line SL of the substrate 110. As described above, regardless of a position of the first group of semiconductor chips 140-1, heights of the first and second chip structures CT1 and CT2 may be reduced, and a thickness (h) of the encapsulant 160 on the uppermost one of the semiconductor chips in the chip structures CT1 and CT2 may be maintained within a predetermined or desired range.

Figure 5:
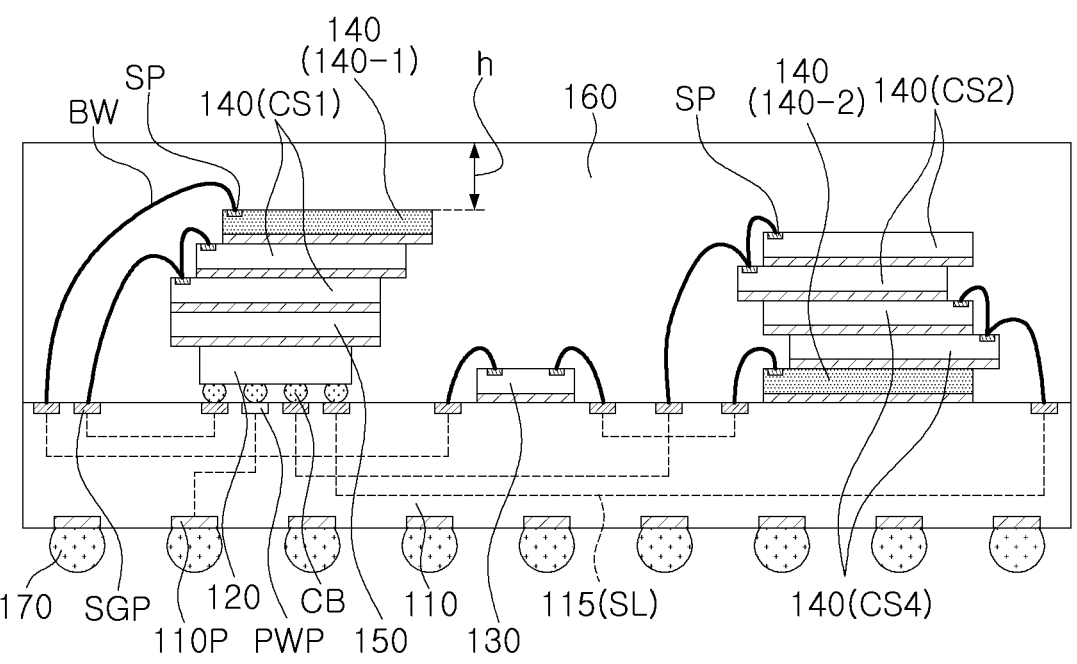
FIG. 5 is a cross-sectional view illustrating a semiconductor package according to an example embodiment of the present inventive concept.

FIG. 5 is a cross-sectional view illustrating a semiconductor package 100C according to an example embodiment of the present inventive concept.

Referring to FIG. 5, the semiconductor package 100C according to an example embodiment may have the same or similar characteristics as those described with reference to FIGS. 1 to 3, except that a second group of semiconductor chips 140-2 are disposed at a bottom of the second chip structure CT2. The second group of semiconductor chips 140-2 according to this example embodiment may be disposed between the substrate 110 and the fourth chip stack CS4. The second group of semiconductor chips 140-2 may be connected to the buffer chip 130 through the signal terminal SGP and the signal line SL of the substrate 110. A stacking order of the second chip stack CS2 and the fourth chip stack CS4 stacked on the second group of semiconductor chips 140-2, a connection direction of the bonding wires BW, and the like are limited to those illustrated in the drawings. As described above, regardless of a position of the second group of semiconductor chips 140-2, heights of the first and second chip structures CT1 and CT2 may be reduced, and a thickness (h) of the encapsulant 160 on the uppermost one of the semiconductor chips in the chip structures CT1 and CT2 may be maintained within a predetermined or desired range.

Figure 6:
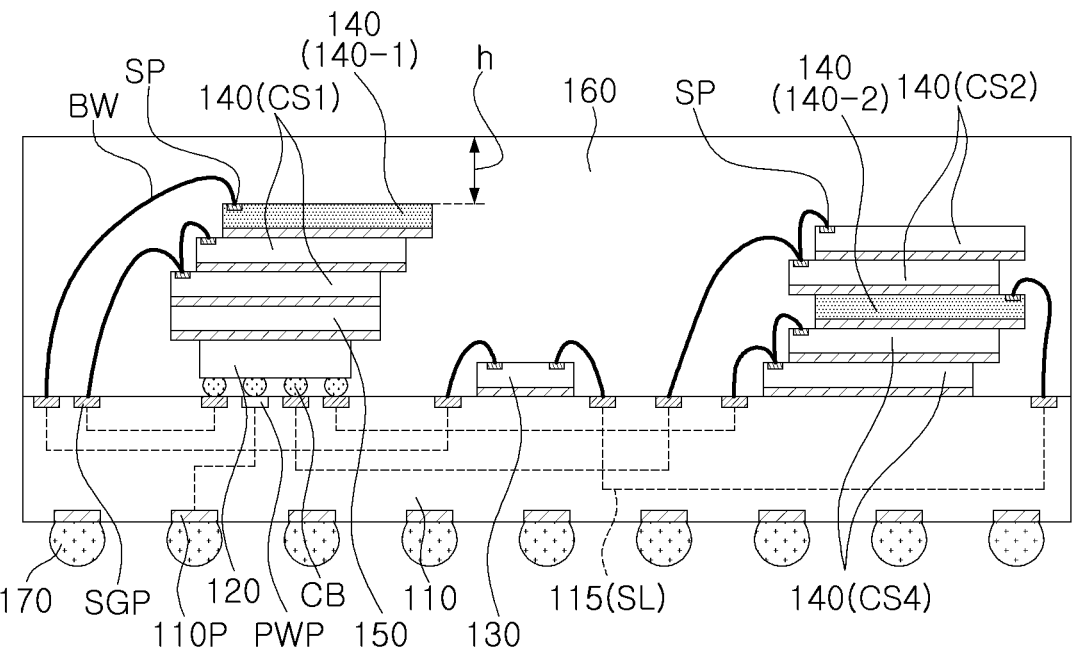
FIG. 6 is a cross-sectional view illustrating a semiconductor package according to an example embodiment of the present inventive concept.

FIG. 6 is a cross-sectional view illustrating a semiconductor package 100D according to an example embodiment of the present inventive concept.

Referring to FIG. 6, the semiconductor package 100D according to an example embodiment may have the same or similar features as those described with reference to FIGS. 1 to 3, except, that a second group of semiconductor chips 140-2 are disposed in the middle of a second chip structure CT2. The second group of semiconductor chips 140-2 according to this example embodiment may be disposed between the second chip stack CS2 and the fourth chip stack CS4. The second group of semiconductor chips 140-2 may be connected to the buffer chip 130 through the signal terminal SGP and the signal line SL of the substrate 110. A stacking order of the second chip stack CS2 and the fourth chip stack CS4, a connection direction of the bonding wire BW, and the like are not limited to those illustrated in the drawings. As described above, regardless of a position of the second group of semiconductor chips 140-2, heights of the first and second chip structures CT1 and CT2 may be reduced, and a thickness (h) of the encapsulant 160 on the uppermost one of the semiconductor chips in the chip structures CT1 and CT2 may be maintained within a predetermined or desired range.

Figure 7:
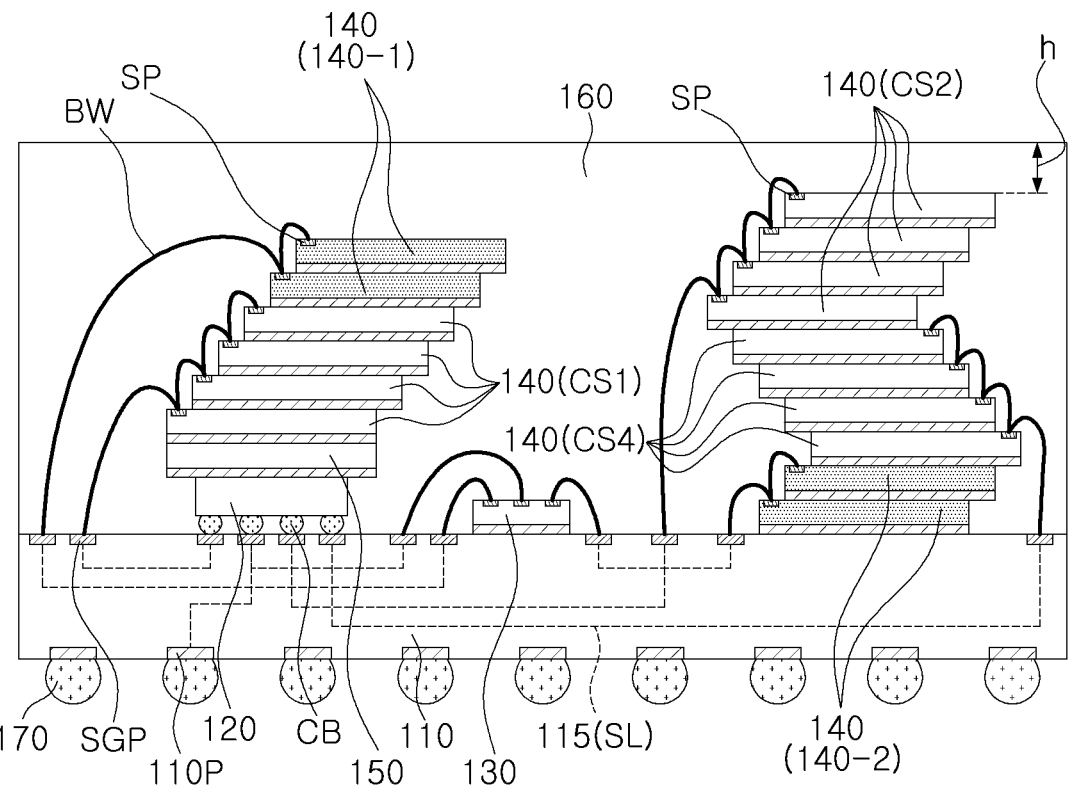
FIG. 7 is a cross-sectional view illustrating a semiconductor package according to an example embodiment of the present inventive concept.

FIG. 7 is a cross-sectional view illustrating a semiconductor package 100E according to an example embodiment of the present inventive concept.

Referring to FIG. 7, the semiconductor package 100E of an example embodiment may have the same or similar features as those described with reference to FIGS. 1 to 6, except for including a greater number of semiconductor chips 140 than the embodiments of FIGS. 3 to 6. In an example embodiment, each of chip stacks CS1, CS2, CS3, and CS4 may include three or more semiconductor chips 140. For example, each of the first chip stack CS1, the second chip stack CS2, the third chip stack CS3, and the fourth chip stack CS4 may include four semiconductor chips 140. In this case, each of the first group of semiconductor chips 140-1 and the second group of semiconductor chips 140-2 may include two semiconductor chips 140. Depending on example embodiments, the number of semiconductor chips 140 in the first group and the number of semiconductor chips 140 in the second group may be different from each other. The semiconductor chip 140 in the first group and the semiconductor chip 140 in the second group may be connected to a controller chip 120 through a buffer chip 130. That is, the first group of semiconductor chips 140 and the second group of semiconductor chips 140 may be connected to the controller chip 120 through the same channel. A thickness (h) of the encapsulant 160 above an uppermost one of the semiconductor chips 140 included in the chip structures CT1 and CT2 may be about 100 μm or more, for example, in a range from about 100 μm to about 150 μm, from about 110 μm to about 130 μm, and the like. As described above, by distributing the semiconductor chips 140 constituting the third chip stack CS3 into semiconductor chips of a first group of semiconductor chips 140-1 and semiconductor chips of a second group of semiconductor chips 140-2, heights of the first and second chip structures CT1 and CT2 may be reduced, and the thickness (h) of the encapsulant 160 on the uppermost one of the semiconductor chips 140 in the chip structures CT1 and CT2 may be maintained within a predetermined or desired range.

As set forth above, according to example embodiments of the present inventive concept, by connecting semiconductor chips of a chip stack that are distributed to each other by a buffer chip, a semiconductor package having a reduced thickness may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package, comprising:
a substrate comprising an interconnection circuit;
a controller chip on a first surface of the substrate, the controller chip electrically connected to the interconnection circuit;
a first chip stack on the controller chip, the first chip stack electrically connected to the interconnection circuit;
a second chip stack on the substrate in adjacent, spaced apart relationship with the first chip stack, the second chip stack electrically connected to the interconnection circuit;
a third chip stack comprising a first group of semiconductor chips above or below the first chip stack and a second group of semiconductor chips above or below the second chip stack, the third chip stack electrically connected to the interconnection circuit;
a buffer chip on the substrate between the first chip stack and the second chip stack, the buffer chip electrically connected to the third chip stack and the controller chip through the interconnection circuit;
an encapsulant encapsulating at least a portion of the first chip stack, the second chip stack, and the third chip stack; and
connection bumps on an opposite second surface of the substrate, the connection bumps electrically connected to the interconnection circuit,
wherein the first chip stack and the second chip stack are directly electrically connected to the controller chip, and
wherein the third chip stack is electrically connected to the controller chip by the buffer chip.

2. The semiconductor package of claim 1, wherein a number of semiconductor chips in the first group of semiconductor chips is less than a number of semiconductor chips in the first chip stack.

3. The semiconductor package of claim 1, wherein a number of semiconductor chips in the first group of semiconductor chips is less than a number of semiconductor chips in the second chip stack.

4. The semiconductor package of claim 1, wherein a number of semiconductor chips in the first group of semiconductor chips is equal to a number of semiconductor chips in the second group of semiconductor chips.

5. The semiconductor package of claim 1, wherein a number of semiconductor chips in the third chip stack is equal to a number of semiconductor chips in the first chip stack and a number of semiconductor chips in the second chip stack.

6. The semiconductor package of claim 1, wherein each of the semiconductor chips in the first chip stack comprises a first signal pad, a first power pad, and a first ground pad, wherein each of the semiconductor chips in the second chip stack comprises a second signal pad, a second power pad, and a second ground pad, and wherein each of the semiconductor chips in the third chip stack comprises a third signal pad, a third power pad, and a third ground pad, wherein the first signal pad, the second signal pad, and the third signal pad are electrically insulated from each other.

7. The semiconductor package of claim 6, wherein the first signal pad and the second signal pad are electrically insulated from the buffer chip.

8. The semiconductor package of claim 6, wherein the third signal pad is electrically connected to the buffer chip.

9. The semiconductor package of claim 1, wherein the first chip stack, the second chip stack, and the third chip stack are wire bonded on the substrate.

10. The semiconductor package of claim 1, wherein the controller chip is flip-chip bonded on the substrate, and wherein the buffer chip is wire bonded on the substrate.

11. The semiconductor package of claim 1, wherein a thickness of the encapsulant on an uppermost one of the semiconductor chips in the first chip stack, the second chip stack, and the third chip stack is about 100 μm or more.

12. The semiconductor package of claim 1, wherein the first chip stack, the second chip stack, and the third chip stack each comprise a plurality of memory chips.

13. The semiconductor package of claim 1, further comprising:

a spacer between the controller chip and the first chip stack or between the controller chip and the first group of semiconductor chips.

14. The semiconductor package of claim 1, further comprising:

a fourth chip stack above or below the second chip stack, the fourth chip stack electrically connected to the interconnection circuit.

15. The semiconductor package of claim 14, wherein the fourth chip stack is directly electrically connected to the controller chip.

16. A semiconductor package, comprising:

a substrate comprising an interconnection structure;

a controller chip and a buffer chip on the substrate in adjacent spaced apart relationship, the controller chip and the buffer chip electrically connected to each other through the interconnection structure;

first and second chip structures on the substrate in adjacent spaced apart relationship, the first and second chip structures comprising a plurality of chip stacks electrically connected to the controller chip through the interconnection structure; and an encapsulant encapsulating at least a portion of the first and second chip structures, wherein the plurality of chip stacks comprise a first chip stack in the first chip structure, a second chip stack in the second chip structure, and a third chip stack having semiconductor chips in the first chip structure and semiconductor chips in the second chip structure, wherein the third chip stack is electrically connected to the controller chip by the buffer chip, and wherein the first chip stack and the second chip stack are directly electrically connected to the controller chip.

17. The semiconductor package of claim 16, wherein each of semiconductor chips in the first chip stack and the second chip stack comprises signal pads, power pads, and ground pads, wherein the signal pads are electrically insulated from the buffer chip.

18. A semiconductor package, comprising:

a substrate comprising an interconnection circuit;

a controller chip and a buffer chip on the substrate in adjacent spaced apart relationship, the controller chip and the buffer chip electrically connected to each other by the interconnection circuit;

first and second chip structures on the substrate in adjacent spaced apart relationship, the first and second chip structures comprising a plurality of chip stacks electrically connected to the controller chip through the interconnection circuit; and an encapsulant encapsulating at least a portion of the first and second chip structures, wherein a first portion of a plurality of semiconductor chips in the plurality of chip stacks are directly electrically connected to the controller chip, and a second portion of the plurality of semiconductor chips in the plurality of chip stacks are electrically connected to the controller chip by the buffer chip.

19. The semiconductor package of claim 18, wherein a first group of the second portion of the plurality of semiconductor chips is in the first chip structure and a second group of the second portion of the plurality of semiconductor chips is in the second chip structure.

* * * * *